United States Patent [19]
Edlinger et al.

[11] 4,148,055
[45] Apr. 3, 1979

[54] INTEGRATED CIRCUIT HAVING COMPLEMENTARY BIPOLAR TRANSISTORS

[75] Inventors: Wolfgang F. J. Edlinger, Son, Netherlands; Michel De Brebisson, Caen, France; Jean-Pierre H. Biet, Bieville-Beuville, France; Jean-Michel Decrouen, Argences, France

[73] Assignee: U.S. Philips Corporation, New York, N.Y.

[21] Appl. No.: 907,819

[22] Filed: May 19, 1978

Related U.S. Application Data

[63] Continuation of Ser. No. 753,272, Dec. 22, 1976, abandoned.

[30] Foreign Application Priority Data

Dec. 29, 1975 [FR] France .............................. 75 39963

[51] Int. Cl.² ............................................ H01L 27/02

[52] U.S. Cl. ..................................... 357/44; 357/41; 357/52; 357/55; 357/59; 357/92
[58] Field of Search ....................... 357/44, 46, 52, 55, 357/59, 92

[56] References Cited

U.S. PATENT DOCUMENTS

| | | | |
|---|---|---|---|
| 3,617,827 | 11/1971 | Schmitz et al. | 357/46 |
| 3,977,019 | 8/1976 | Matsushita et al. | 357/46 |
| 3,978,515 | 8/1976 | Evans et al. | 357/46 |

*Primary Examiner*—Edward J. Wojciechowicz
*Attorney, Agent, or Firm*—Thomas A. Briody; James J. Cannon, Jr.

[57] ABSTRACT

An integrated circuit having two vertical complementary bipolar transistors formed from a semiconductor substrate of a first conductivity type, and a deposited layer of second semiconductor type is disclosed. Conductor tracks consisting of portions of the semiconductor layer are supported by a dielectric, while other portions of the semiconductor layer are used for the contacts for certain active zones of the transistors.

17 Claims, 13 Drawing Figures

Figure 1:
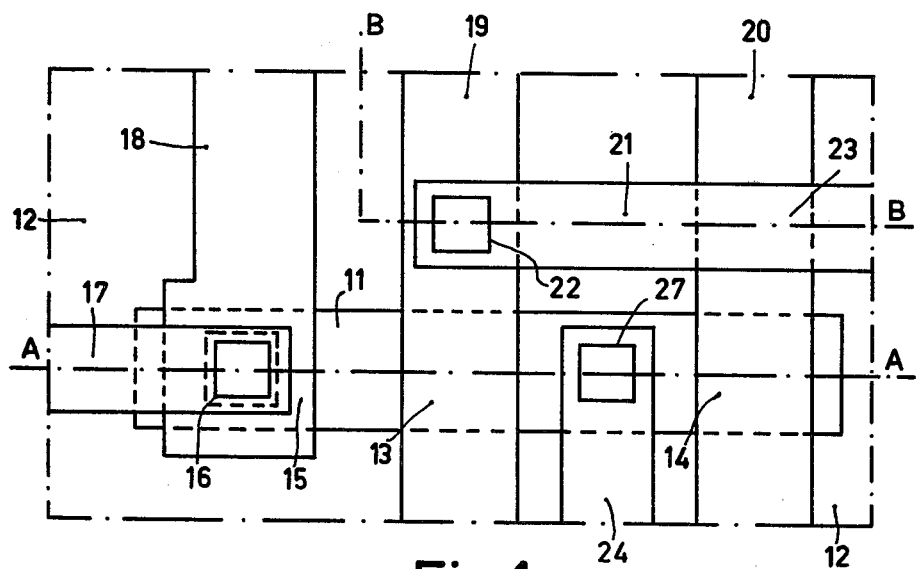
Figure 2:
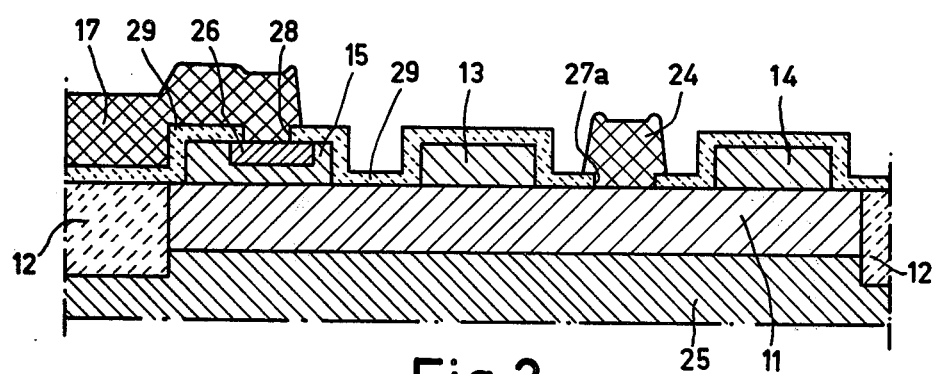

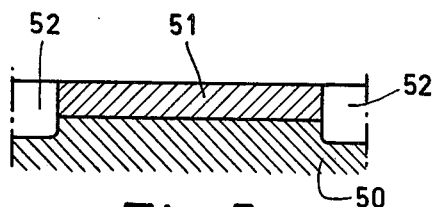
Fig.5a
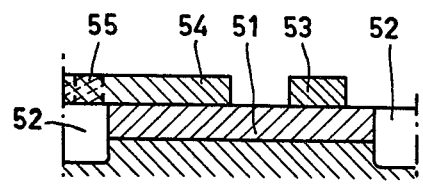
Fig.5b1
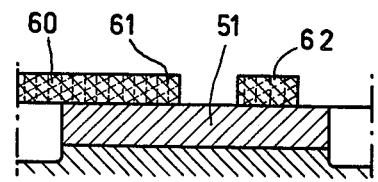
Fig.5b2
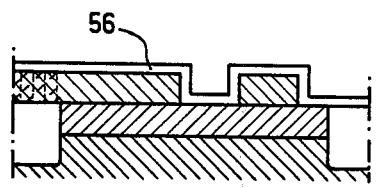
Fig.5c1
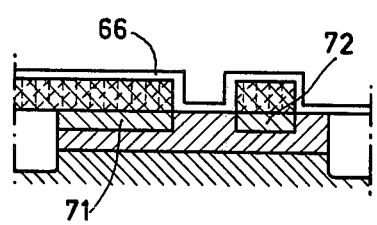
Fig.5c2
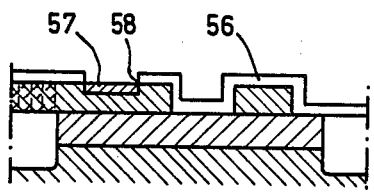
Fig.5d1
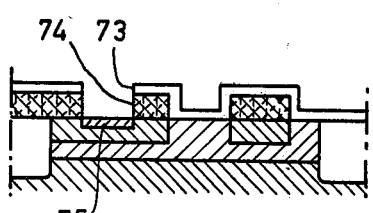
Fig.5d2
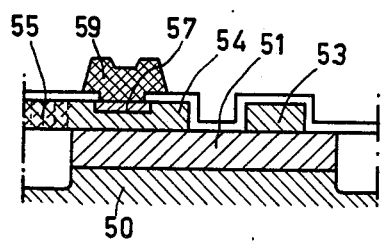
Fig.5e1
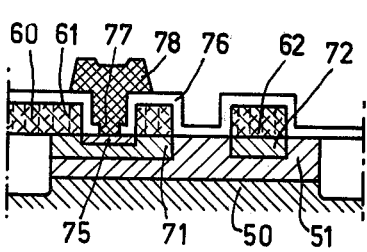
Fig.5e2

INTEGRATED CIRCUIT HAVING COMPLEMENTARY BIPOLAR TRANSISTORS

This is a continuation, of application Ser. No. 753,272, filed Dec. 22, 1976, now abandoned.

The present invention relates to an integrated circuit comprising a semiconductor body of which at least a substrate region of a first conductivity type supports a number of local regions of the second conductivity type which is opposite to the first conductivity type. The regions are substantially of the same thickness. The circuit comprises domains of insulating material adjoining the local regions, and in addition at least a first bipolar transistor having three vertically arranged successive zones, a first of the zones belonging to the substrate region, a second of the zones which forms the base of the transistor belonging to one of the local regions, and the third of the zones which is of the first conductivity type being situated above the one local region which separates the third zone from the substrate region. The circuit comprises in addition at least a second bipolar transistor having three successive zones, a first of the three zones being an emitter zone, the first and second transistors being of a type complementary to each other, the collector zone of the second transistor belonging to one of the local regions.

The present invention relates in addition to the method of manufacturing such an integrated circuit.

This type of device is known and is frequently used in electronic semiconductor industry.

An important example of integrated circuits of this type is the family of the products which are termed "integrated injection logic" and which are also known by the abbreviation "I$^2$L," which abbreviation will hereinafter be used to indicate the products. A detailed description hereof is to be found, for example, in the French Patent Application which has been published under U.S. Pat. No. 2,138,905, and corresponding copending U.S. application Ser. No. 674,065 filed Apr. 15, 1976.

This kind of integrated circuits usually comprises bipolar transistors of a vertical structure which in general have several surface collectors and in which the base regions are coupled to complementary transistors which provide a bias current.

The methods generally used for the manufacture of "I$^2$L" devices have so far been substantially the same as those which serve to manufacture families of bipolar logic integrated circuits according to earlier techniques, for example, the logic comprising transistors and resistors which is known by the abbreviation "T$^2$L" (or "TTL"), which is an abbreviation of the English expression "transistor-transistor-logic."

Such methods comprise in particular the combination of steps such as: the growth or deposition of an insulating protecting layer on the surface of the semiconductor body which in general is silicon, the provision of apertures in the layer by photoetching, the local diffusion of impurities, the growth of epitaxial layers, ion implantation, the connection of several elements of the circuit by means of vapour-deposited metal layers which are converted into a network of connections by photoetching, in which the the network can be provided on a single level or at different levels if the complicated character of the circuit justifies this. One of the principal reasons of the use of the conventional method for manufacturing circuits of the "I$^2$L"-type is that in this manner the possibility exists of integrating peripheral parts of the electronic circuit on the same semiconductor body, which parts consist of elements of the earlier families. As a result of this the input and/or output signals of the circuit may be compatible with those of other circuits of the earlier families.

However, by using such conventional methods of manufacturing circuits of the "I$^2$L"-type whch are just designed with a view to the compatibility with other families, a number of drawbacks present themselves: the number of manufacturing steps is high, which can be demonstrated by the fact that one has had to resort to ten or more different etching masks for the manufacture of the device.

It is easy to understand that the manufacturing yield of an integrated circuit is considerably influenced by the number of operations which is necessary for manufacturing same. This is even more pronounced in relation with large scale integration or LSI, that is complex circuits having a very large number of elements in which the circuits each occupy a comparatively large area of the semiconductor substrate. The probability of causing an error which is destructive for the operation of the circuit actually increases rapidly with the number of operations and with the area occupied by the circuit.

From this it follows that the development of bipolar integrated circuits with an ever increasing complexity, is impeded by technical and economical restrictions which are related to the low manufacturing yields.

Although the introduction of the "I$^2$L" technique especially aims at the improvement of said situation and in particular the further shifting of the complexity limit of the integrated circuits with bipolar transistors, the situation remains that the use of the conventional structures of integrated circuits which necessitate methods involving a large number of steps, involves a practical and economical limit of LSI of even more complex functions.

Although one may resort to the mutual connection of the elements of the circuits with a network at different levels, which, due to the resulting wiring facilities, usually enables a small reduction of the area occupied by the circuit, the potential gain of the manufacturing yield which might result herefrom is substantially compensated by the introduction of extra steps in to the method, which steps are particularly delicate because they contribute to the increase of the relief of the surface of the circuit, which relief involves an increased risk of defects as a result of interruptions of the metal track, for example on the edge of the slopes.

It is the object of the invention to mitigate these drawbacks. These drawbacks which are cited with reference to the logic circuits of the "I$^2$L" type are characteristic of all integrated circuits having bipolar transistors, so that the invention, although it may be used in particular for circuits of the "I$^2$L"-type, also relates to all circuits having bipolar transistors of the kind mentioned in the preamble.

It is an object of the present invention to improve such integrated circuits so that they have a structure which enables simple manufacture.

The invention is based inter alia on the recognition that this can be achieved by a particular use of a deposited semiconductor layer.

According to the present invention, an integrated circuit comprising a semiconductor substrate of which at least a surface part of a first conductivity type supports a number of local regions of the second conductivity type which is opposite to the first conductivity type, in which the regions are substantially of the same thickness, the circuit comprising domains of insulating material adjoining the local regions, the circuit comprising in addition at least a first bipolar transistor having three vertically arranged successive zones, a first of the zones belonging to the surface part of the substrate, a second of the zones which forms the base of the transistor belonging to one of the local regions, and the third of the zones which is of the first conductivity type being situated above the one local region which separates the third zone from the surface part of the substrate, the circuit comprising in addition at least a second bipolar transistor having three successive zones, a first of three zones being a collector zone, a second being a base zone and a third being an emitter zone, the first and second transistors being of a type complementary to each other, the collector zone of the second transistor belonging to one of the local regions, is characterized in that the three zones of the second transistor are also arranged vertically, in which a semiconductor layer configuration of a first conductivity type extends partly over the domains of insulating material so as to form at least a connection track, and partly on the local region to which the collector zone of the second transistor belongs, so as to form at least a contact for the base zone of the second transistor.

This structure presents the advantage that the gain of the second transistor can be adjusted more easily than in the case of a transistor having a horizontal structure by varying structural characteristic features, and in particular that it can be adjusted at a high value, if this should be desired. The additional advantage of the structure according to the invention is that it occupies a less surface area at the surface of the semiconductor body and hence results in more compact circuits. From this it follows in particular that the manufacturing yield is higher so that the cost price may be lower. Similar advantages as regards yield and cost price result in addition from the fact that the integrated circuit according to the invention is suitable in particular for a manufacture with a simplified method which involves a comparatively small number of steps. This method itself also forms part of the present invention.

The risk of the occurrence of manufacturing errors is minimized. Thus the structure according to the invention serves as a base for the manufacture of more complex monolithic integrated circuits, that is to say with a larger number of elements and this in economically favourable conditions.

An additional advantage of the structure according to the invention is that the consumed estimated power of the integrated circuits is comparatively small. Another advantage is that a more independent choice is possible of the properties of the semiconductor material which forms the base zone of the second transistor and that which forms the first zone of the first transistor which belongs to the substrate region. Thus a delicate compromise of the properties of materials is not necessary and by a suitable choice of the individual properties of regions in particular better performance of the device can be obtained.

Finally the circuit according to the invention presents the advantage that its structure is suitable for being manufactured according to a simplified method with a relatively small number of steps, which method itself forms part of the present invention. In the present invention, the fabrication of interconnections at two levels are obtained substantially by the same operations which are normally used in a circuit having only a single connection level. Since the number of manufacturing steps is reduced, the yield is improved and consequently the cost is reduced.

A preferred embodiment of the invention is characterized in that the configuration moreover extends over the local region to which the base zone of the first transistor belongs and forms an electrical contact for the third zone of the first transistor. In this manner a considerable simplification of the manufacturing operations of the integrated circuit is obtained.

Because in an important application of the invention the first transistor has the first zone, that is the substrate region, as an emitter and comprises several third zones which form the equally large number of collectors which are situated above the local region which forms the base of the first transistor, the advantage in this case also applies to all the collectors.

In a preferred embodiment of the invention the base zone of the second transistor is situated in a first monocrystalline layer portion of the semiconductor layer configuration which is situated on the local region to which the collector zone of the second transistor belongs, while in a favourable extension of the embodiment the third zone of the first transistor comprises a second monocrystalline layer portion of the semiconductor layer configuration in which the second layer portion is situated on the local region to which the base of the first transistor belongs. This structure is particularly suitable for being manufactured with a simplified method. As a matter of fact it is favourable to deposit the semiconductor layer in such circumstances that the growth occurs mainly monocrystalline on the surface parts of the semiconductor body which are not occupied by the insulating domains so that after providing the configuration the base zone of the second transistor, the third zone or the third zones of the first transistor and conductor tracks which may be connected to the zones are simultaneously obtained.

In a variation of the embodiment according to the invention the base zone of the second transistor is situated in a first monocrystalline region of the first conductivity type, the first region being situated below a first part of the layer configuration and being in contact therewith, the first region being situated in the local region to which the collector zone of the second transistor belongs, while in a favourable extension of the embodiment, the third zone of the first transistor comprises a second monocrystalline region of the first conductivity type, which second region is situated below a second part of the layer configuration and is in contact therewith, the second region being situated in the local region to which the base zone of the first transistor belongs.

A favorable embodiment of such a structure of an integrated circuit according to the invention differs from the preceding one in that the deposited semiconductor layer need not necessarily comprise monocrystalline parts. The base zone of the second transistor and, according to the favourable extension, the third zone of the first transistor are then formed by the monocrystalline regions which themselves are realized by diffusion of impurities from the parts of the semiconductor layer configuration.

Proceeding in this manner, one benefits by the advantage that the impurity concentration in the semiconductor layer may be made maximum without this presenting any drawback for the crystalline character of the parts thereof. With a given thickness of the layer one then has connection tracks with a minimum resistance.

Another advantageous embodiment of the invention is characterized in that the local regions of the second conductivity type are bounded laterally at least partly by a band of insulating material which forms at least a part of the insulating domains and which in the depth extends down to and reaches the substrate region, the connection track which belongs to the semiconductor layer configuration extending mainly over the insulating band.

In this case one profits not only by known advantages which are inherent in said isolation technique for example in particular the increase of the integration density of the elements of the circuit, the reduction of the parasitic capacitances of the elements and of the interconnections relative to the substrate and the decrease of the relief at the surface of the completed integrated circuit, but in addition by the fact that the isolation method used in the structure according to the invention results in a particularly simple manufacturing method in which the isolation bands also constitute the supprt and preferably the only support for the connection tracks.

Figure 3:
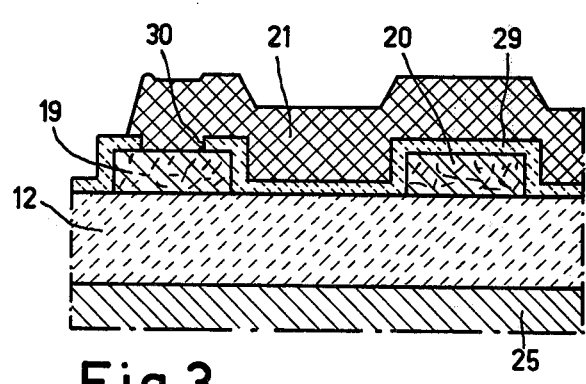
Figure 4:
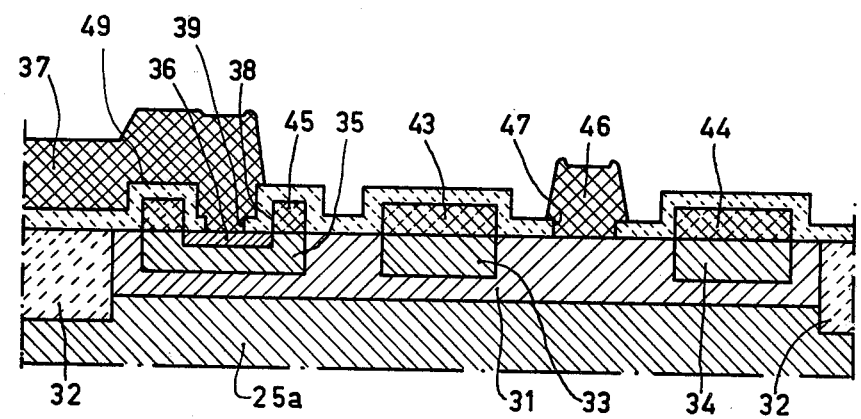

The invention will now be described in greater detail with reference to the accompanying diagrammatic drawings, in which FIG. 1 is a plan view of a part of an integrated circuit according to the invention, FIG. 2 is a diagrammatic sectional view of the same part of the integrated circuit taken on the line AA of FIG. 1, FIG. 3 is a sectional view of another detail of the same part of the integrated circuit according to the invention taken on the line BB of FIG. 1, FIG. 4 is a sectional view of a part of another integrated circuit according to the invention, FIGS. 5a to $5e_1$ show diagrammatically the principal steps of an advantageous method of manufacturing an integrated circuit according to the invention, while FIGS. $5b_2$ to $5e_2$ show a variation of the method.

The plan view of FIG. 1 relates to an integrated circuit of the "I$^2$L" type in which the invention is used. In this example the semiconductor substrate is of monocrystalline silicon of the n-type which has a high concentration of doping impurities. In the proximity of an active or major surface the semiconductor body has a number of local regions of substantially the same thicknesses and of the type which is opposite to that of the substrate, so in this example the p-type. One of these local regions is referenced 11 in the drawing. The region 11 is electrically isolated from the remainder of the circuit, on the one hand by the p-n junction which the region 11 forms with the surface part of the n-type semiconductor substrate which is situated below said region and is not visible in the plane of FIG. 1, and on the other hand laterally by bands of insulating material 12, for example silicon dioxide, which have such a thickness that they extend down to or into the surface part 25 of the n-type substrate.

A first bipolar npn transistor which operates with surface collector and deeply situated emitter, as is often the case in the "I$^2$L" circuits, has a first zone, in this case the emitter, which belongs to the surface part of the substrate, as is denoted by 25 in FIG. 2. The second zone which forms the base of the npn transistor consists of a part of, and belongs to, the local region 11.

Said transistor has two collectors which are formed by the n-type regions 13 and 14 (FIG. 1) which are provided on the local region 11.

A part of the same local region 11 plays the role of collector zone for a second bipolar transistor whose polarity is opposite to that of the first, that is in this case a complementary pnp-type. The base of the second transistor comprises an n-type zone 15 which extends over or above the local region 11. The emitter 26 of this pnp-transistor is situated at the surface of the base zone and is provided in a manner which will be described hereinafter. According to the invention, the structure of the second transistor is that of a vertical pnp transistor. The contact with the emitter of the transistor is shown in FIG. 1 by the part 16 of the metal track 17, which track forms part of a network of connections between certain elements of the circuit. In this example, the metal track 17 is of aluminium in a thickness of the order of 1 micrometer. According to the invention the connection tracks 18, 19, 20 are parts of a semiconductor layer configuration, in this case a thin layer of strongly doped n-type silicon.

FIG. 1 shows moreover a metal track 24 which is in contact with the local region 11 via the part 27 of track, and a metal track 21 which is in electrical contact with the track 19 of the layer configuration, the contact zone being denoted by the part 22 of the track 21. The track 21 crosses the semiconductor track 20 without making contact therewith in the area 23 where tracks are situated over each other because a layer 29 of insulating material, for example a layer of silicon dioxide, separates the metal track from the semiconductor track. The insulating layer extends over the surface of the whole body and below the network of metal tracks, except in the contact places 16, 22 and 27.

The track 17 which is connected to the emitter of the pnp-transistor at 16 crosses and is isolated from the circumference or edge of the base zone 15 and the local region 11.

FIG. 2 is a diagrammatic sectional view of the part of the integrated circuit shown in FIG. 1 taken on the line AA. The local region 11 which in the example is an epitaxial layer of the p-type in a thickness of approximately 0.6 micrometer is supported by the n-type substrate of which a part is denoted by 25.

The thick oxide bands 12 laterally bound the local region 11 and extend in the depth further than the epitaxial layer. A sunken oxide of this type can be obtained by the known method of local oxidation of silicon, according to which method a silicon nitride mask is used against thermal oxidation, while by means of apertures the oxidation is obtained in the places where this is desired. According to a particularly simple preferred embodiment of the invention which is very suitable to form a large number of elementary regions which have different functions and for which the same number of operations is used, the base zone 15 of the pnp transistor is formed in a monocrystalline part of the semiconductor layer configuration, which part corresponds to a place where said part of the semiconductor layer is in direct contact with the local region 11. The emitter zone 26 of the pnp transistor is situated at the surface in the zone 15. Said emitter zone is of the p-type, has a high doping level of impurities and can be obtained in known manner, for example, by diffusion or ion implantation. The sectional view of FIG. 2 also shows the metal track 17 which in the example is of aluminium and which contacts the emitter 26 in the aperture 28 in the layer of insulating material 29, as well as the track 24 which is connected to the local region 11 via the aperture 27a.

According to an extension of described preferred embodiment of the invention the collector zones 13 and 14 of the npn transistor are formed by monocrystalline parts of the semiconductor layer configuration, which parts correspond to places where the semiconductor layer is in direct contact with the local region 11. Outside the parts forming the zones 13, 14 and the zone 15 the semiconductor layer configuration is supported by the thick oxide bands 12 so that, due to the method of providing which will be explained hereinafter, the material of the layer generally is polycrystalline.

FIG. 3 is also a sectional view of a part of the circuit shown in FIG. 1 taken on the line BB.

At the level of the line BB the semiconductor tracks 19 and 20 are supported by the thick oxide band 12 which isolates the tracks from the substrate 25.

FIG. 3 shows an example of a metal contact with a semiconductor track and of an isolated crossing of connections according to a preferred embodiment of the invention. The insulating layer 29 separates electrically the metal track 21 from the semiconductor track 20 so that an isolated cross-over of connections is formed, while an aperture 30 is provided in the layer to obtain an electrical contact between the semiconductor track 19 and the metal of the track 21.

It is to be noted that in the cell of the integrated circuit as shown in FIGS. 1, 2 and 3 and following the I²L method, the emitter of the npn transistor can be directly connected to a large number of other emitters of similar npn transistors. This can be realized with the n-type substrate which forms the electrode connected to reference potential. In general the base of the pnp-transistors is also connected to the potential. In the structure according to the invention, because the connection is not directly ensured by the semiconductor zones, the connection is made by means of a conductor track which is connected to the substrate by means of an external connection or, for example, via a deep n-type contact region which is diffused through the epitaxial p-type layer or in another suitable manner. The advantage of the structure according to the invention is that it enables a connection to the base of the pnp transistors via which said base can be set at a potential, in the case in which this is desired, for example, by including an impedance element in the connection.

It is to be noted that the part of the circuit described by way of example is susceptible of numerous variations without departing from the scope of this invention. For example, the circuit according to the invention is not necessarily of the "I²L" type but may generally be any circuit of the type with complementary bipolar transistors.

The collector of the pnp transistor and the base of the npn transistor need not be situated in the same local region, as described above. When they are situated in different local regions the advantage occurs of an independent choice as regards the potentials of the two zones.

In the embodiment described the semiconductor body or wafer which forms the substrate is of the n-type and is homogeneous, which is favorable from a point of view of simplification of the manufacture. However, it is also possible that only surface parts of the substrate are of the n-type, the remainder of the substrate being of the p-type, and/or of insulating material. In one of these cases the surface part or parts of the substrate may be formed by means of a homogeneous layer, a double layer or a multi-layer structure, which enables special requirements as regards the operation or performance of the circuit to be satisfied.

A local region, for example the region 11 in FIG. 2, can also be obtained by means of any known technology other than the epitaxial deposition and, for example, by ion implantation or diffusion. The isolation in the lateral direction of the local region is described as having been obtained by means of a thick oxide, which presents the advantage of simplicity in manufacture, associated with area savings and performance, which advantages are known per se for this type of isolation. However, the isolation might also be realized by means of a p-n junction. In that case the n-type bands which surround the local p-type region will have to be covered with a layer of insulating material, at least in the places where the semiconductor layer configuration extends, so that it is isolated from the n-type bands.

In the case of such an isolation by a junction, the n-type bands which are in direct electrical contact with the surface parts of the substrate present an advantageous access for the reference potential in numerous points at the surface of the circuit.

It will be obvious that, without departing from the scope of this invention, the npn transistor shown in FIGS. 1 and 2 might have only one collector, or more than two collectors instead of two collectors.

The insulating layer which is denoted by 29 in FIGS. 2 and 3 and which in the embodiment described is a layer of silicon oxide may also consist of another insulating material, for example silicon nitride or aluminium oxide, or may be composed of several successive layers of insulating material of different characters.

As regards the metal connection network of the elements of the circuit which is complementary with respect to the layer configuration, it will be obvious that the aluminium stated in the example is not the only material which is suitable for this purpose and that any other metal or combination of metals suitable for this purpose and conventionally used in semiconductor industry may be used. The embodiment described has one single level of metal interconnections, which, in combination with the layer configuration according to the invention, presents integration possibilites for complex functions which are comparable to those presented by the use of interconnections at two levels, in which, when the invention is used, no extra operations will be necessary as compared with a conventional method with one single level of interconnections. Without departing from the scope of this invention, the integrated circuit, however, may also be provided with more than two metal levels so that the elements of an even more complicated circuit can more easily be interconnected.

An example of an isolated cross-over between two connection levels has been described with reference to FIG. 3, in which the first level is formed by a connection track of silicon. Without departing from the scope of this invention, the track may be connected at the two ends thereof to a metal track of the complementary network, so that mainly an isolated cross-over with another metal track of the network is formed. This semiconductor connection track also forms part of the layer configuration according to the invention.

Furthermore, the conductivity types of the various regions of the structure according to the invention may be interchanged so that the polarities of the transistors described are interchanged.

FIG. 4 relates to a part of an integrated circuit which is shown in a diagrammatic sectional view, and which is a modification of an embodiment of the invention. On the active or major surface of the strongly doped n-type silicon slice 25a an epitaxial layer 31 is deposited which forms a local p-type region which is isolated laterally by thick oxide bands 32 which are formed by local oxidation of the epitaxial layer.

An npn transistor is formed by an emitter which belongs to the surface part of the substrate 25a, by a base which consists of a part of the local region 31, and by two collector regions. One collector is formed by an n-type region 33 which is the continuation in the local region 31 of a part 43 of a semiconductor layer configuration which is also of the n-type, the part 43 being in contact with the region 33.

In the same manner the other collector of the npn transistor is formed by the region 34 underlying the part 44 and in contact therewith, the part 44 also belonging to the layer configuration.

FIG. 4 also shows a pnp transistor. The collector zone thereof forms part of the region 31. The base zone thereof lies in the n-type region 35 which is in contact with the part 45 of the semiconductor layer configuration. A p-type zone 36 which forms the emitter of the pnp transistor is situated at the surface of the region 35. A metal track 37 is connected to the emitter zone 36 via the aperture 38 which is provided in the part 45 of the semiconductor layer configuration and via the aperture 39 in the insulating layer 49 which is narrower. The insulating layer covers furthermore the surface of the device and electrically separates the connection track 37 from the remainder of the circuit, as well as all other tracks of the metal connection network, everywhere where this is necessary. A metal track 46 is connected to the local region 31 via the aperture 37 in the insulating layer 49. According to this preferred embodiment of the invention, the connection tracks, for example those which are denoted in FIG. 1 by 18, 19 and 20, are formed from the layer of silicon which is supported by the thick oxide bands. The said silicon layer is polycrystalline as a result of the support and of the way in which the layer is provided.

Starting from the part of the silicon layer configuration which bears on a local region, the n-type region is preferably formed by causing the impurities to diffuse into the layer of the part so that the conductivity type of the part of the local region underlying the part of the silicon layer is reversed. In this manner it is not necessary for the silicon layer of the configuration to be monocrystalline in whatever place. The particular advantage is obtained that the concentration of impurities in the silicon layer may be very high, which makes it possible to reduce the resistance of the tracks of the configuration to a minimum value.

FIGS. 5a and 5e₁ relate to a particularly favourable embodiment of an integrated circuit according to the invention. An n-type silicon slice having a resistivity of 8 to $14.10^{-3}$ ohm.cm is first covered with an epitaxial p-type silicon layer the characteristic features of which in this example are: resistivity 0.5 to 3 ohm.cm, thickness 0.5 to 0.8 $\mu$m. The epitaxial layer is then divided into local regions by insulating bands which are manufactured, for example, by means of the already mentioned known method of local oxidation of the silicon.

FIG. 5 is a diagrammatic sectional view of the preparatory step of the method in which the surface part of the substrate, which is of the n-type, is denoted by reference numeral 50, and the epitaxial layer by 51. The lateral boundary is obtained by the thick oxide bands 52.

The entire surface of the local regions has been exposed, which treatment step requires no mask. By means of an extra mask, only certain parts of the local regions might be exposed.

Deposited on the whole active or main surface is a thin layer of n-type silicon whose characteristics are as follows: resistivity approximately 2 to $4.10^{-2}$ ohm.cm, thickness approximately 0.5 to 0.8 $\mu$m and a monocrystalline structure of the parts which are supported by the exposed parts of the local regions. For this purpose the layer is deposited at a sufficiently high temperature, for example 1050° C. or higher, if silane (SiH₄) is used as a silicon source, or approximately 1100° C. or higher, if trichlorosilane (SiHCl₃) is used. The deposited silicon layer proves to have a polycrystalline or amorphous structure at the area where it is deposited on a material having an unorganized structure, such as the thick oxide of the isolation or also on a layer of insulating material which could have been maintained partly at the surface of the local region.

The layer is subjected to a photoetching treatment by means of the methods known in semiconductor technology for removing the non-useful parts of the layer, the configuration according to the invention remaining. The configuration comprises on the one hand polycrystalline connection tracks which are supported by thick oxide bands, for example the track which is denoted by 55 in FIG. 5b₁, and on the other hand monocrystalline parts which are supported by local regions, for example the parts 53 and 54, which are supported by the local region 51.

In this example the track 55 and the part 54 adjoin each other. However, the two parts of the configuration may alternatively not contact each other.

A layer of insulating material is then provided on the surface of the semiconductor body or slice, for example by vapor-phase deposition of silicon oxide, in a thickness in the order of 0.5 to 0.7 $\mu$m. A silicon nitride layer might be deposited instead of the above-stated oxide layer or also a double layer, an oxide-nitride layer, which enables a favorable use of the selective dissolving properties of the oxide with respect to the nitride for the realization in two steps of the apertures of which the second is self-aligned with respect to the first. The layer might also be manufactured by a simple thermal oxidation of the silicon layer configuration. This stage in the method is shown in FIG. 5c₁ in which the insulating layer is denoted by 56. FIG. 5d₁ shows the circuit in a later stage of the method in which the p+ type zone 57 which forms the emitter of the pnp transistor is provided by means of a method known in semiconductor technology, for example by implantation of boron ions to a depth of approximately 0.2 $\mu$m in the aperture 58 which is provided for this purpose in the insulating layer 56. The wafer is then annealed at 900° C. in such manner that the implanted boron is activated and the surface is covered in addition with an insulating layer in which the apertures are provided which are necessary for contacting the metal connection network. The network is manufactured, for example by means of an aluminum layer, thickness 1 $\mu$m.

FIG. 5e₁ shows the resulting device. The pnp transistor is formed by the emitter zone 57 which is provided with a metal contact 59, the base zone 54 which belongs to the deposited silicon layer configuration and adjoins the track 55 which belongs to the same layer configuration, while the collector zone of the pnp transistor belongs to the local region 51.

An npn transistor has a base zone 51 which is constructed in common with the collector of the pnp transistor. This npn transistor has its collector at the surface. According to a preferred embodiment of the invention the collector is formed by a part 53 of the layer configuration. The npn transistor furthermore has a base region which belongs to the local region 51 and an emitter region which belongs to the surface part 50 of the silicon substrate.

FIGS. $5b_2$ to $5e_2$ show several stages of a variation of the preferred method of manufacturing the circuit arrangement according to the invention. The local p-type regions are manufactured on an n-type silicon slice in the same manner as described with reference to FIG. 5a. The thickness of the epitaxial layer is slightly larger, for example in the order of 0.7 to 1 $\mu$m.

A thin n-type silicon layer is then deposited whose characteristics are approximately as follows: resistivity 3 to $5.10^{-4}$ ohm.cm, thickness 0.3 to 0.5 $\mu$m. This layer is deposited at a temperature of 650° to 700° C., silane being used as a silicon source. At this comparatively low deposition temperature and taking into account the very high concentration of impurities provided in the layer, the layer as a whole has a polycrystalline amorphous structure, which in this variation of the method is not annoying.

The layer is then etched in the required configuration shape which is shown by way of example in FIG. $5b_2$ as a connection track 60 which continues into the part 61 extending above the local region 51, in which furthermore another part 62 is also situated on the local region.

The slice is then subjected to a thermal treatment at, for example, 1000° C., so that the impurities diffuse into the local region and form n-type regions which are denoted in FIG. $5c_2$ by 71 and 72. The depth of said diffusion is approximately 0.4 $\mu$m. During the diffusion the layer is oxidized at the surface. Dependent on the thickness of the resulting oxide, a complementary layer may be provided by deposition from the vapour phase in such manner that the resulting layer 66 is sufficient for the later steps requiring masking.

In the layer 66 thus formed an aperture is provided which is referenced 73 in FIG. $5d_2$ and which continues into a similar aperture 74 in the silicon layer. The p+ type zone 75 is then provided, for example, by implantation of boron ions.

FIG. $5e_2$ shows the circuit obtained in this manner. The insulating layer 76 comprises apertures for the contact connections to the network of metal tracks. One of the apertures is denoted by 77 and one of the metal tracks is shown as the emitter contact 78. The pnp transistor furthermore has a base zone 71 and a collector zone which belongs to the local region 51.

The part 61 of the layer configuration according to the invention is in contact with the region of the same conductivity type which forms the base 71 of the pnp transistor, while the same layer configuration also forms a connection track 60. The npn transistor according to a preferred variation of the embodiment has a collector which is formed by the region 72 and the contact therefor is formed by the part 62. The base zone of the transistor belongs to the local region 51 and the emitter zone belongs to the surface part 50 of the silicon substrate.

The invention is not restricted to the embodiments described. Many variations are possible to those skilled in the art without departing from the scope of this invention. For example, instead of silicon other semiconductor materials, for example germanium or $A_{III}B_V$ compounds may be used.

What is claimed is:

1. An integrated circuit comprising
 a semiconductor substrate region of a first conductivity type;
 a local region of semiconductor material of a second conductivity type disposed on said substrate region, having a first main surface adjoining said substrate region, and a second main surface opposite said first surface;
 first and second regions of insulating material, said first region at least partially adjoining said second main surface of said local region, said second region of insulating material at least partially laterally bounding said local region;
 a first bipolar transistor having first, second and third vertically arranged successive zones, said second zone forming the base zone of said first transistor and coinciding with said local region, said first zone making rectifying contact with said base zone and comprising at least the portion of said substrate region adjoining said base zone, and said third zone making rectifying contact with said base zone and situated at said second main surface of said local region;
 a second bipolar transistor complementary to said first transistor having first, second and third vertically arranged successive zones, said first zone being a collector zone, said second zone being a base zone, and said third zone being an emitter zone; said collector zone of said second transistor coinciding with said local region; and
 a semiconductor layer of said first conductivity type extending partially over said second region of insulating material for forming a connection track, and partially over said local semiconductor region, at least a first portion of said semiconductor layer comprising said base zone of said second transistor.

2. An integrated circuit as claimed in claim 1, wherein a second portion of said semiconductor layer extends over said local region and forms an electrical contact for said third zone of said first transistor.

3. An integrated circuit as claimed in claim 1, wherein said first zone of said first transistor constitutes an emitter zone, and said third zone comprises a plurality of separate collector zones located at said second main surface of said local region.

4. An integrated circuit as claimed in claim 1, further comprising a complementary network of conductor tracks which, at least in certain places, is separated by said first insulating region from said semiconductor layer, ones of said conductor tracks of said network being connected to said semiconductor layer through apertures in said first insulating region.

5. An integrated circuit as claimed in claim 1, wherein said first portion of said semiconductor layer comprising said base zone of said second transistor is monocrystalline and is located on said local region; said emitter zone of said second transistor being located in said first monocrystalline layer portion.

6. An integrated circuit as claimed in claim 5, wherein said third zone of said first transistor comprises a second monocrystalline layer portion of said semiconductor layer, said second layer portion being located on said local region.

7. An integrated circuit as claimed in claim 2, wherein said base zone of said second transistor comprises a first monocrystalline region of said first conductivity type, said first region underlying a first portion of said semiconductor layer and being in contact therewith, said first region being located in said local region, said first portion of said semiconductor layer having an aperture.

8. An integrated circuit as claimed in claim 7, wherein said third zone of said first transistor comprises a second monocrystalline region of said first conductivity type, said second region underlying a second portion of said semiconductor layer and being in contact therewith, said second monocrystalline region being located in said local region.

9. An integrated circuit as claimed in claim 1, wherein said second region of insulating material comprises a band of insulating material extending in depth down to and reaching the surface of said substrate region.

10. An integrated circuit as claimed in claim 1, wherein said base zone of said first transistor and said collector zone of said second transistor share a common portion of said local region which forms a direct d.c. connection between said base zone and said collector zone.

11. A method of manufacturing an integrated circuit from a semiconductor substrate including a major surface region of first conductivity type comprising the steps of:
    forming a plurality of local semiconductor regions of the second conductivity type on said major surface of said semiconductor substrate;
    forming regions of insulating material adjoining said local regions;
    forming a semiconductor layer extending over at least a portion of said local semiconductor regions and a portion of said insulating regions;
    doping said semiconductor layer with impurities for causing said layer to become first conductivity type; and
    patterning said semiconductor layer for forming a predetermined semiconductor layer configuration.

12. A method as claimed in claim 11, further comprising the steps of: subsequently forming an insulating layer at least in part over said local regions and said semiconductor layer providing apertures in said insulating layer and subsequently forming over said insulating layer complementary network of conductor tracks connected to said semiconductor layer configuration through said apertures.

13. A method as claimed in claim 11, wherein the step of forming said semiconductor layer is performed under such circumstances that said layer grows mainly monocrystalline on the portion of the surface not occupied by said regions of insulating material, and further comprising the step of forming the emitter zone of a transistor as an island of the second conductivity type in the same portion of said semiconductor layer configuration which forms the base zone of said transistor.

14. A method as claimed in claim 11, further comprising the steps of:
    subsequently subjecting the integrated circuit to a thermal treatment whereby said impurities diffuse forming a region of the first conductivity type in said local semiconductor region below the semiconductor layer configuration, and
    forming an island of second conductivity type comprising the emitter zone of a transistor in the monocrystalline semiconductor layer of the first conductivity type which corresponds to the base zone of said transistor.

15. A method as claimed in claim 14, comprising the step of
    subsequently forming an aperture for a contact in the portion of said semiconductor layer configuration located above said region.

16. A method as claimed in claim 11, wherein said step of forming regions of insulating material comprises the steps of:
    providing a mask which can withstand oxidation having apertures through which local oxidation of the semiconductor material of said semiconductor substrate can occur; and
    laterally bounding said local semiconductive regions at least partially by means of bands of insulating material extending in the depth down to the surface part of said semiconductor substrate and formed by a local oxidation of the semiconductor material through said apertures.

17. A method as claimed in claim 13, wherein the step of forming the island of the second conductivity type which forms the emitter zone of said transistor is achieved by ion implantation.

* * * * *